United States Patent
Inaba et al.

(10) Patent No.: US 9,093,675 B2
(45) Date of Patent: *Jul. 28, 2015

(54) METHOD OF MANUFACTURING NON-FIRING TYPE ELECTRODE

(71) Applicant: E I DU PONT DE NEMOURS AND COMPANY, Wilmington, DE (US)

(72) Inventors: Akira Inaba, Kawasaki (JP); Ji-Yeon Lee, Kanakawa-ken (KR)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 363 days.

This patent is subject to a terminal disclaimer.

(21) Appl. No.: 13/746,157

(22) Filed: Jan. 21, 2013

(65) Prior Publication Data

US 2014/0202735 A1   Jul. 24, 2014

(51) Int. Cl.
*H01M 4/04*   (2006.01)
*H05K 3/12*   (2006.01)
*H05K 1/09*   (2006.01)

(52) U.S. Cl.
CPC .......... *H01M 4/0402* (2013.01); *H01M 4/0435* (2013.01); *H05K 3/1283* (2013.01); *H05K 1/092* (2013.01); *H05K 2203/1545* (2013.01)

(58) Field of Classification Search
CPC .. B22F 1/0088; B22F 1/0085; B22F 2998/10; B22F 2999/00; B22F 2998/00
See application file for complete search history.

(56) References Cited

U.S. PATENT DOCUMENTS

| | | | |
|---|---|---|---|
| 5,371,327 A * | 12/1994 | Fujinami et al. | 174/257 |
| 2004/0026363 A1 * | 2/2004 | Akamatsu et al. | 216/13 |
| 2005/0219789 A1 * | 10/2005 | Akimoto et al. | 361/306.1 |
| 2008/0206641 A1 * | 8/2008 | Christensen et al. | 429/218.1 |
| 2009/0169724 A1 | 7/2009 | Ogiwara | |
| 2010/0021735 A1 * | 1/2010 | Akimoto et al. | 428/403 |
| 2010/0220429 A1 * | 9/2010 | Norieda et al. | 361/502 |
| 2013/0341194 A1 * | 12/2013 | Fuchsbichler et al. | 205/50 |

* cited by examiner

*Primary Examiner* — Veronica F Faison

(57) ABSTRACT

A method of manufacturing a non-firing type electrode comprising steps of: (A) applying on a substrate a conductive paste comprising, (a) a conductive powder comprising, (i) a first conductive powder having Young's modulus of $60 \times 10^9$ Pa or higher; and (ii) a second conductive powder having Young's modulus of $5 \times 10^9$ to $50 \times 10^9$ Pa; and (b) an organic vehicle, (B) heating the applied conductive paste at 50 to 350° C. to form an electrode; and (C) pressing the electrode at 10 to 1000 kN/m² of plane surface pressure or at 5 to 300 kN/m of linear pressure.

11 Claims, 1 Drawing Sheet

METHOD OF MANUFACTURING NON-FIRING TYPE ELECTRODE

FIELD OF INVENTION

The present invention relates to a method of manufacturing a non-firing type electrode.

TECHNICAL BACKGROUND OF THE INVENTION

Non-firing type electrodes are widely used in various electrical devices. The term "non-firing type electrode" is defined as an electrode formed without a heat treatment at temperature of 350° C. or higher.

US20090169724 discloses a method for producing a non-firing type electrode of membrane touch switch by (a) screen printing a conductive paste containing silver powder, phenoxy resin, urethane resin and an organic solvent on a polymer film, and (b) heating the printed conductive paste at 140° C.

BRIEF SUMMARY OF THE INVENTION

An objective is to provide a method of manufacturing a non-firing type electrode which can have sufficient electrical property despite of using less conductive metal powder.

An aspect of the invention relates to a method of manufacturing a non-firing type electrode comprising steps of: (A) applying on a substrate a conductive paste comprising, (a) a conductive powder comprising, (i) a first conductive powder having Young's modulus of $60 \times 10^9$ Pa or higher; and (ii) a second conductive powder having Young's modulus of $5 \times 10^9$ to $50 \times 10^9$ Pa; and (b) an organic vehicle, (B) heating the applied conductive paste at 50 to 350° C. to form an electrode; and (C) pressing the electrode at 10 to 1000 kN/m² of plane surface pressure or at 5 to 300 kN/m of linear pressure.

Another aspect of the invention relates to an electrical device comprising the non-firing type electrode manufactured by the method above.

The non-firing type electrode having sufficient conductivity can be formed by the present invention. Moreover the consumption of the first conductive powder can reduce by the present invention.

DETAILED DESCRIPTION OF THE INVENTION

The method of manufacturing the non-firing type electrode comprises steps of (A) applying on a substrate a conductive paste, (B) heating the applied conductive paste to form an electrode, and (C) pressing the electrode. The method and materials to form non-firing type electrode explained below.

Method of Manufacturing an Electrode

An example of the method of manufacturing the non-firing type electrode is explained with reference to FIG. 1A to 1C.

Figure 1A:
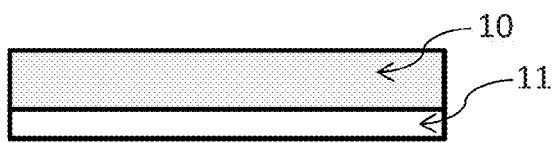
FIG. 1, A to C, explains an embodiment of the method of manufacturing the electrode in the present invention.

The conductive paste 10 is applied onto a substrate 11 as illustrated in FIG. 1A. To apply the conductive paste on the substrate, screen printing, stencil printing, gravure printing, offset printing, spin coating, blade coating, casting, or nozzle discharge can be available. The screen printing can be selected because the paste can be quickly screen printed in the desired pattern on a substrate in an embodiment.

The substrate 11 can be glass substrate, polymer film, semiconductor substrate, ceramic substrate or metal substrate in an embodiment. The substrate 11 can be selected depending on electrical devices, for example a glass or polymer substrate for touch panel, a semiconductor substrate for solar cell, and a ceramic substrate for capacitor or chip resistor. A metal substrate that has good thermal conductivity can be suitable for electrical devices that need heat radiation such as a light emitter diode (LED). When the substrate 11 is a metal substrate or a semiconductor substrate, an insulating layer can be formed on the substrate 11 to not get electrical continuity between the substrate and the formed electrode.

In an embodiment, the substrate 11 can be a polymer film. Polymer film is in general flexible enough to not be broken by pressing. The polymer film can be a polyethylene terephthalate (PET) film, polyethylene naphthalate (PEN) film, polyimide (PI) film, polyimideamide film, polyamide film, polypropylene film, or polyethylene film. In the event of heating the conductive paste at over 100° C. in the later heating step, the polymer substrate can be the polymer film having heat resistance such as the PET film, PEN film or the PI film.

The applied conductive paste 10 on the substrate 11 is heated. By heating, the applied conductive paste which is viscous can become non-viscous enough to not be adhesive to a pressing tool in the subsequent pressing step. The heating temperature is 50 to 350° C., 60 to 250° C. in another embodiment, 70 to 200° C. in another embodiment. The heating time can be 1 to 120 minutes in an embodiment, 3 to 90 minutes in another embodiment, 5 to 50 minutes in another embodiment. In the event that the conductive paste is heat-curable, the applied paste can get cured by evaporations of solvent and/or by the molecular structure in the thermosetting polymer turned into net-like structure under the heat.

In another embodiment, the conductive paste can be heated at 50 to 120° C. just to become non-viscous before the pressing step (C). The electrode can be heated again after the pressing step (C) at relatively high temperature, for example 100 to 350° C., to be firmly cured. In the event of heating the electrode twice, the method of manufacturing a non-firing type electrode comprising steps of: (A) applying a conductive paste on a substrate; (B) heating the applied conductive paste at 50 to 120° C. to form an electrode; (C) pressing the electrode at 10 to 1000 kN/m² of plane surface pressure or at 5 to 300 kN/m of linear pressure; and (D) heating the pressed electrode at 100 to 350° C., in an embodiment. The heating temperature in the heating step (D) can be 110 to 220° C. in another embodiment, 120 to 180° C. in another embodiment.

A heating machine such as an oven, a dryer, and a furnace that can control the temperature can be used for heating.

The electrode can be obtained by heating the applied conductive paste. The applied conductive paste which is non-viscous by being heated to have electrical conduction is called "electrode" in this specification.

Figure 1B:
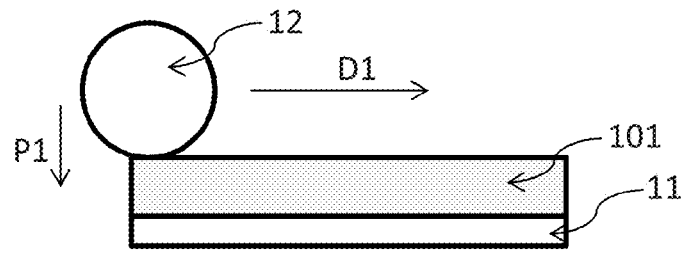
Figure 1C:
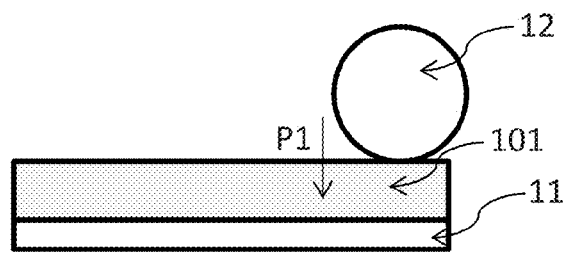

In an embodiment, the electrode is pressed at 5 to 300 kN/m of linear pressure in the direction of P1, which is the perpendicular direction to the plane of the boundary between the electrode 101 and the substrate 11, by a roll 12 moving on the upper surface of the electrode 101 in the direction of D1, which is parallel to the plane of the boundary between the electrode 101 and the substrate 11, as illustrated in FIG. 1B and FIG. 1C.

The linear pressure is a pressure on line on the upper and/or rear surface of the electrode. The linear pressure moves to one direction to press entire upper surface and/or rear surface of the electrode.

The pressure strength can be selected according to, for example, thickness of the electrode, kind of the conductive powder, or type of the substrate. The linear pressure can be 22 to 200 kN/m in another embodiment, 35 to 125 kN/m in another embodiment, and 45 to 98 kN/m in still another embodiment. By being pressed in such range, resistivity of the electrode can be lowered as shown in Example below.

Figure 2:
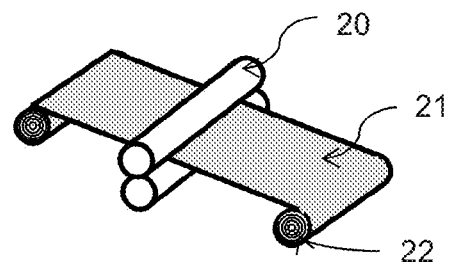
FIG. 2 illustrates an embodiment of roll to roll system in the step of pressing the electrode by a calendar roll.

In the event of employing the liner pressure, the substrate 21 on which the electrode is formed can be a continuous roll 22 and pressed with the calendar roll 20 in a roll to roll system in another embodiment as illustrated in FIG. 2. The substrate can be a polymer film which is flexible enough to make the roll 22 when employing the roll to roll system. The substrate 21 is threaded through the calendar roll 20 which linearly presses the electrode on the substrate. "Calendar" is in general a machine having two or more rolls to thread a substance between the rolls to press the substance.

The electrode 101 can be also pressed at 10 to 1000 kN/m$^2$ of plane surface pressure. The plane surface pressure is a pressure on the entire upper and/or rear surface of the electrode 101 at the same time. Any method to make the plane surface pressure can be available, for example crank press, crankless press, or knuckle joint press. Presumptively air bubbles between the conductive particles in the electrode could be pushed out of the electrode by the press to result in getting high conductivity.

The surface pressure can be 32 to 720 kN/m$^2$ in another embodiment, 65 to 580 kN/m$^2$ in another embodiment, and 100 to 470 kN/m$^2$ in still another embodiment.

The pressing is carried out just once or twice in an embodiment. The electrode could obtain lower resistivity by pressing just once as shown in Example below. Being pressed three times or more could damage the electrode and the substrate.

In an embodiment, the method further comprises a step (D) of secondly heating the electrode to firmly cure after the pressing step (C). The heating temperature of the second heating after the pressing step can be 100 to 350° C. in an embodiment, 110 to 220° C. in another embodiment, 120 to 180° C. in another embodiment.

The method of manufacturing the electrode can optionally employ photolithography. In the event of photolithographic method, the conductive paste is photosensitive and the method can further contain a step of exposing the electrode to light to cure between the step of heating (B) and the step of pressing (C) or after the step of pressing (C). In another embodiment, the method of manufacturing the non-firing type electrode comprises steps of (A) applying on a substrate a conductive paste, (B) heating the applied conductive paste to form an electrode, (E) exposing the electrode to light, and (C) pressing the electrode. In another embodiment, the method of manufacturing the non-firing type electrode comprises steps of (A) applying on a substrate a conductive paste, (B) heating the applied conductive paste to form an electrode, (C) pressing the electrode, (E) exposing the electrode to light.

The exposing condition can be controlled according to photosensitivity of the photosensitive paste and thickness of the applied conductive paste. The cumulative exposure is 50 to 2000 mJ/cm$^2$ in an embodiment.

When the conductive paste or the substrate is unfavorable to be wet, the electrode is formed by applying the conductive paste with a desired pattern and exposed to light without an aqueous development.

However when both of the substrate and the electrode are fine to be wet, the exposing step can be followed by a developing step with an aqueous solution. The photolithographic method using the developing step is advantageous especially when forming a fine pattern. The fine pattern can comprises lines with width of 1 to 200 μm and space between the lines of 1 to 200 μm in an embodiment; width of 5 to 160 μm and space between the lines of 3 to 160 μm in another embodiment; width of 10 to 110 μm and space between the lines of 3 to 110 μm in another embodiment. The thickness of the fine pattern electrode can be 1 to 20 μm in an embodiment.

The aqueous solution can be an alkaline solution such as a 0.4% sodium carbonate solution. The aqueous solution can be sprayed to the exposed conductive paste to remove the unexposed area of the conductive paste so that the cured pattern by the photo-energy shows up.

For the photolithographic method and photosensitive conductive paste, US5143819, US5075192, US5032490, US7655864 can be herein incorporated by reference.

The method of manufacturing the non-firing type electrode can be applicable to any electrical devices. In an embodiment, the electrical devices such as solar cell, resistor, capacitor, heater, touch panel, sensor, membrane touch switch, and defogger on an automotive window can contain the non-firing type electrode manufactured by the method explained above.

Conductive Paste

The conductive paste used in the method can be any type such as heat-curable and photosensitive. The conductive paste comprises at least (a) a conductive powder and (b) an organic vehicle. The conductive paste materials are explained in detail below.

(a) Conductive Powder

The conductive powder is a powder made of any material having electrical conductivity. The conductive powder is 100 parts by weight in an embodiment. The conductive powder is 55 to 98 weight percent (wt %) in an embodiment, 68 to 96 wt % in another embodiment, and 75 to 93 wt % in still another embodiment based on the weight of the conductive paste.

The conductive powder comprises (i) a first conductive powder having Young's modulus of $60 \times 10^9$ Pa or higher, and (ii) a second conductive powder having Young's modulus of $5 \times 10^9$ to $50 \times 10^9$ Pa.

Young's modulus, also known as the tensile modulus, is a measure of the stiffness of a material calculated as follows.

$$\text{Young's modulus} = T/S$$

where T is tension calculated as [(Stress (N))/(Cross section area (m$^2$))], and S is strain ratio calculated as [(Length of the material under the tension T (m)−Original length of the material (m))/Original length of the material (m)].

The first conductive powder having relatively high Young's modulus is hard so that the particles hardly deform by being pressed in the pressing step. The second conductive powder having relatively low Young's modulus is soft so that the powder could deform by being pressed consequently to fill space between the first conductive powder particles and connect the particles.

(i) First Conductive Powder

The first conductive powder is a metal powder having Young's modulus of $60 \times 10^9$ Pa or higher. Each Young's modulus is Al: $68.3 \times 10^9$ Pa, Ni: $207 \times 10^9$ Pa, Cu: $110 \times 10^9$ Pa, Ag: $76 \times 10^9$ Pa, Au: $80 \times 10^9$ Pa, Pt: $152 \times 10^9$ Pa, Pd: $110 \times 10^9$ Pa, Rh: $359 \times 10^9$ Pa, Ru: $414 \times 10^9$ Pa, Mo: $324 \times 10^9$ Pa, and W: $345 \times 10^9$ Pa. The Young's modulus of the first conductive powder can be $60 \times 10^9$ to $150 \times 10^9$ Pa in another embodiment, $60 \times 10^9$ to $100 \times 10^9$ Pa in another embodiment.

The first conductive powder is a metal powder having an electrical conductivity $1.00 \times 10^7$ Siemens per meter (S/m) or more at 293 Kelvin in another embodiment. The first conductive powder can comprise a metal selected from the group consisting of aluminum (Al: $3.64 \times 10^7$ S/m), nickel (Ni: $1.45 \times 10^7$ S/m), copper (Cu: $5.81 \times 10^7$ S/m), silver (Ag: $6.17 \times 10^7$ S/m), gold (Au: $4.17 \times 10^7$ S/m), molybdenum (Mo: $2.10 \times 10^7$ S/m), tungsten (W: $1.82 \times 10^7$ S/m), alloy thereof and a mixture thereof in an embodiment.

In another embodiment, the conductive powder is a metal powder having an electrical conductivity $3.00 \times 10^7$ S/m or more at 293 Kelvin. The first conductive powder can comprises a metal selected from the group consisting of Al, Cu, Ag, Au, alloy thereof and a mixture thereof in another embodiment. The first conductive powder can comprise Ag, Cu, Ag—Cu alloy or a mixture thereof in another embodiment. Such metals are widely obtainable in the market.

The first conductive powder is 10 wt % or higher in an embodiment, 28 wt % or higher in another embodiment, 51 wt % or higher in another embodiment, 60 wt % or higher in another embodiment, 72 wt % or higher in another embodiment, and 81 wt % or higher in still another embodiment, based on the total weight of the conductive powder. The first conductive powder is 99 wt % or lower in an embodiment, 95 wt % or lower in another embodiment based on the total weight of the conductive powder. Within the range, conductivity of the electrode can be sufficient as shown in Example below.

There is no limitation on shape of the first conductive powder. In an embodiment, the first conductive powder is flaky, spherical, or nodular, or a mixture thereof in shape in an embodiment. In another embodiment, the first conductive powder is flaky in shape. The flaky powder could increase contact area of the each other, consequently could render sufficient conductivity to the formed electrode.

There is no restriction on the particle size of the conductive powder. The particle diameter (D50) can be 0.1 to 50 µm in an embodiment, 1 to 35 µm in another embodiment, 1.5 to 19 µm in another embodiment.

The particle diameter is obtained by measuring the distribution of the particle diameters by using a laser diffraction scattering method. The median which is 50th percentile of the particle size distribution as measured by volume is defined as D50 to represent the particle diameter. Microtrac model X-100 is an example of the commercially-available devices that can be used for this measurement.

(ii) Second Conductive Powder

The second conductive powder is made of any conductive material having electrical conductivity having Young's modulus of $5 \times 10^9$ to $50 \times 10^9$ Pa.

The second conductive powder can comprises an electrically conductive material selected from the group consisting of tin (Sn), bismuth (Bi), lead (Pb), indium (In), gallium (Ga), and a mixture thereof in an embodiment. Each Young's modulus is Sn: $41.4 \times 10^9$ Pa, Bi: $31.7 \times 10^9$ Pa, Pb: $14 \times 10^9$ Pa, In: $10.8 \times 10^9$ Pa, and Ga: $9.8 \times 10^9$ Pa. The second conductive powder comprises Sn, Bi, an alloy thereof or a mixture thereof in an embodiment.

The volume resistivity of the pressed electrode can lower by adding the second conductive powder as shown in Example below. The conductive powder can comprise a metal selected from the group consisting of Sn, Bi, alloy thereof and a mixture thereof.

The second conductive powder is 1 wt % or higher in an embodiment, 3 wt % or higher in another embodiment, 5 wt % or higher in another embodiment, 10 wt % or higher in another embodiment, and 35 wt % or higher in still another embodiment, based on the total weight of the conductive powder. The second conductive powder is 90 wt % or lower in an embodiment, 82 wt % or lower in another embodiment, 70 wt % or lower in another embodiment, 51 wt % or lower in another embodiment, 42 wt % or lower in another embodiment, 27 wt % or lower in another embodiment, and 10 wt % or lower in still another embodiment, based on the total weight of the conductive powder. Within the range, conductivity of the electrode can be sufficient as shown in Example below.

There is no limitation on shape of the second conductive powder. In an embodiment, the second conductive powder is flaky, spherical, or nodular, or a mixture thereof in shape in an embodiment. In another embodiment, the second conductive powder is spherical.

The particle diameter (D50) of the second conductive powder can be 1 to 50 µm in an embodiment, 2.5 to 42 µm in another embodiment, 5 to 35 µm in another embodiment. The particle diameter (D50) is obtained as well as the first conductive powder described above.

When the first conductive powder comprises a noble metal such as Ag, Au, Pt, and Pd, the noble metal consumption can be reduced by mixing the second conductive powder.

In an embodiment, the first conductive powder is 8 to 50 wt % of Cu powder and the second conductive powder is 50 to 92 wt % of Sn powder based on the weight of the conductive powder.

(b) Organic Vehicle

The conductive powder is dispersed into the organic vehicle to form a viscous composition called "paste", having suitable viscosity for applying on a substrate with a desired pattern.

There is no restriction on the composition of the organic vehicle. The organic vehicle can comprise at least an organic polymer and optionally a solvent in an embodiment.

A wide variety of inert viscous materials can be used as the organic polymer. The organic polymer can comprise thermosetting resin, thermoplastic resin, or a mixture thereof.

The thermosetting resin can be epoxy resin, melamine resin, urea resin, unsaturated polyester resin, alkyd resin, polyurethane resin, an organic-inorganic hybrid resin or a mixture thereof.

The thermoplastic resin can be phenol resin, polyethylene, polypropylene, polyethylene terephthalate, polyamide, polyamide-imide, acrylic resin, phenoxy resin, cellulose resin or a mixture thereof.

The organic polymer comprises a mixture of the thermosetting resin and the thermoplastic resin, such as a mixture of epoxy resin and phenoxy resin.

The organic polymer can be 1 to 10 parts by weight in an embodiment, 1.5 to 7 parts by weight in another embodiment.

In the event of the photosensitive conductive paste, the organic vehicle further comprises a photopolymerization initiator and a photopolymerizable compound. The conductive paste that contains the organic vehicle including the photopolymerization initiator and a photo-polymerizable compound can be cured by being exposed to light in the photolithographic method.

The photo-polymerization initiator is a compound that generates a free radical when it is exposed to an actinic ray. The photo-polymerization initiator can be, for example ethyl 4-dimethyl aminobenzoate (EDAB), diethylthioxanthone (DETX), and 2-Methyl-1[4-(methylthio)phenyl]-2-morpholinopropan-1-one. The photo-polymerization initiator can be 0.1 to 3 parts by weight in an embodiment.

The photo-polymerization compound can comprise an organic monomer or an oligomer that includes ethylenic unsaturated compounds having at least one polymerizable ethylene group. Examples of the photo-polymerization compound are ethocylated (6) trimethylolpropane triacrylate, and dipentaerythritol pentaacrylate. The photo-polymerization compound can be 3 to 10 parts by weight in an embodiment.

In the event of the photosensitive conductive paste, the organic polymer can comprise acrylic polymer having a side chain of a hydroxyl group or a carboxyl group, hydroxyethyl cellulose, hydroxypropyl cellulose, hydroxyethyl hydroxypropyl cellulose or a mixture thereof. The acrylic polymer and the cellulose can be soluble in the aqueous solution such as 0.4% sodium carbonate solution in the step of developing the exposed paste.

For the photosensitive conductive paste, US5143819, US5075192, US5032490, US7655864 can be herein incorporated by reference.

The solvent such as dibasic ester, texanol and terpineol can be used to adjust the viscosity of the conductive paste to be preferable for applying onto the substrate. The solvent can be 5 to 35 parts by weight in an embodiment.

The organic vehicle can be, to 100 parts by weight of conductive powder, 5 to 90 parts by weight in an embodiment, 7 to 61 parts by weight in another embodiment, 9 to 42 parts by weight in another embodiment.

The organic vehicle can further comprise an organic additive such as a dispersing agent, a stabilizer and a plasticizer in an embodiment.

The conductive paste can further comprise an inorganic additive such as a metal oxide or a color pigment and/or an organic additive such as a dispersant and a surfactant.

The viscosity of the conductive paste can be 5 to 300 Pascal second in an embodiment, 8 to 100 Pa·s in another embodiment. The viscosity can be measured with a viscometer Brookfield HBT using a spindle #14 at 10 rpm at room temperature.

Example

The present invention is illustrated by, but is not limited to, the following examples.

The electrode was formed with the heat-curable conductive paste.

18 parts by weight of dibasic ester (DBE-9 from INVISTA Inc.) as the solvent and 2 parts by weight of phenoxy resin were mixed together at 100° C. until the resin dissolved to form the organic vehicle.

100 parts by weight of the conductive powder was dispersed well into the organic vehicle to form the heat-curable conductive paste. The conductive powder contained the first conductive powder and the second conductive powder.

The amount of the first conductive powder and the second conductive powder based on the weight of the conductive powder was shown in Table 1.

The conductive powders were as follows.

First conductive powder: flaky Ag powder with D50 of 4 μm (SF-77A, Ferro Corporation) in Example 1 to 7; spherical Cu powder with D50 of 3 μm (6030, Carpenter Technology Corporation) in Example 8 and 9; flaky Cu powder with D50 of 3.2 μm (1200YP, Mitsui mining & smelting CO., Ltd.) in Example 10. Young's modules were Ag: $76 \times 10^9$ Pa and Cu: $110 \times 10^9$ Pa.

Second conductive powder: spherical Sn powder (AT-Sn No. 600, Yamaishi Metal Co., LTd.) with D50 of 8 μm in Example 1 to 4 and Example 8 and 9; spherical Bi powder with D50 of 30 μm (BIE11PB, Kojundo chemical laboratory); spherical Bi powder with D50 of 16 μm (Bi99.9, Hikari Material Industry Co., Ltd.). Young's modules were Sn: $41.4 \times 10^9$ Pa and Bi: $31.7 \times 10^9$ Pa.

The viscosity of the conductive paste was 50 Pa·s as measured with a viscometer Brookfield HBT using a spindle #14 at 10 rpm at room temperature. The degree of the dispersion was measured by fineness of grind (FOG). A typical FOG value was adjusted to 20/10 or less.

The conductive paste was screen printed through a 250 mesh screen mask onto a PET film substrate.

The electrode was obtained by heating the applied conductive paste at 80° C. for 10 minutes. The pattern of the electrode was 50 mm square with thickness of 10 μm.

The electrode was pressed through a hydraulic calendar roll (Yuri roll Co., Ltd.) having two rolls to press at linear pressure of 61 kN/m and roll speed of 1 m/min.

The pressed electrode was heated again at 150° C. for 30 minutes to firmly cure.

Measurement

The volume resistivity of the formed electrode was measured with a resistivity meter (LORESTA-GP from Mitsubishi Chemical Co., Ltd.) before calendar pressing as well as after the calendar pressing.

Result

Figure 3:
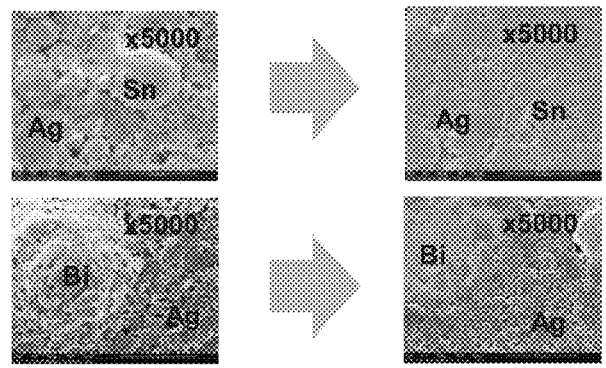
FIG. 3 is pictures of the electrode surface before and after pressing in Example 3 (upper) and Example 6 (lower).

Pictures of the electrode surface before pressing and after pressing which were taken in Example 3 (upper) and Example 6 (lower) are shown as references in FIG. 3 where the Sn powder or the Bi powder deformed to make the electrode surface flat after calendar press.

The volume resistivity of the electrode after pressing lowered drastically in all examples using both the first conductive powder and second conductive powder regardless of the mixing ratio (Example 1 to 10) as shown in Table 1.

In Example 1 to 3 and 5 and 6, the volume resistivity of the electrode after pressing was lower than $16.0 \times 10^{-5}$ Ω·cm while an Ag electrode which contained only Ag powder and no second conductive powder obtained $19.1 \times 10^{-5}$ Ω·cm without being pressed. In Example 8 to 10, the volume resistivity of the electrode lowered down to measurable level after pressing while a non-pressed Cu electrode contained only Cu powder and no Sn powder or Bi powder got too high volume resistivity to measure.

TABLE 1

|  | 1st conductive powder (wt %)* | | 2nd conductive powder (wt %)* | | Volume Resistivity (Ω · cm) | |
| --- | --- | --- | --- | --- | --- | --- |
|  | Ag | Cu | Sn | Bi | Before Calendar | After Calendar |
| Example 1 | 93 | 0 | 7 | 0 | $14.9 \times 10^{-5}$ | $2.6 \times 10^{-5}$ |
| Example 2 | 60 | 0 | 40 | 0 | $18.7 \times 10^{-5}$ | $6.0 \times 10^{-5}$ |
| Example 3 | 35 | 0 | 65 | 0 | $65.0 \times 10^{-5}$ | $15.3 \times 10^{-5}$ |
| Example 4 | 20 | 0 | 80 | 0 | $479 \times 10^{-5}$ | $24.5 \times 10^{-5}$ |
| Example 5 | 91 | 0 | 0 | 9 | $16.3 \times 10^{-5}$ | $1.8 \times 10^{-5}$ |

TABLE 1-continued

|  | 1st conductive powder (wt %)* | | 2nd conductive powder (wt %)* | | Volume Resistivity ($\Omega \cdot$ cm) | |
| --- | --- | --- | --- | --- | --- | --- |
|  | Ag | Cu | Sn | Bi | Before Calendar | After Calendar |
| Example 6 | 58 | 0 | 0 | 42 | $13.1 \times 10^{-5}$ | $2.0 \times 10^{-5}$ |
| Example 7 | 11 | 0 | 0 | 89 | $11.5 \times 10^{-5}$ | $7.3 \times 10^{-5}$ |
| Example 8 | 0 | 81 | 19 | 0 | —** | $1.1 \times 10^{3}$ |
| Example 9 | 0 | 38 | 62 | 0 | —** | 22.0 |
| Example 10 | 0 | 47 | 0 | 53 | —** | $7.9 \times 10^{3}$ |

*Weight percent based on the weight of the conductive powder
**The volume resistivity was too high to measure.

What is claimed is:

1. A method of manufacturing a non-firing type electrode comprising steps of:
   (A) applying on a substrate a conductive paste comprising,
      (a) a conductive powder comprising,
         (i) a first conductive powder having Young's modulus of $60 \times 10^9$ Pa or higher, and
         (ii) a second conductive powder having Young's modulus of $5 \times 10^9$ to $50 \times 10^9$ Pa; and
      (b) an organic vehicle, wherein the substrate a glass substrate, a polymer film or a ceramic substrate;
   (B) heating the applied conductive paste at 50 to 350° C. to form an electrode; and
   (C) pressing the electrode at 10 to 1000 kN/m² of plane surface pressure or at 5 to 300 kN/m of linear pressure.

2. The method of claim 1, wherein the electrode is pressed at 5 to 300 kN/m of linear pressure by a roll.

3. The method of claim 2, wherein the roll is a calendar roll and the substrate with the electrode is a continuous roll and pressed with the calendar roll in a roll to roll system.

4. The method of claim 3, wherein the substrate is a polymer film.

5. The method of claim 1, wherein the conductive paste comprises (i) 100 parts by weight of a conductive powder and (ii) 5 to 90 parts by weight of an organic vehicle.

6. The method of claim 1, wherein the first conductive powder comprising a conductive material selected from the group consisting of aluminum (Al), nickel (Ni), copper (Cu), silver (Ag), gold (Au), platinum (Pt), palladium (Pd), rhodium (Rh), ruthenium (Ru), molybdenum (Mo), tungsten (W), alloy thereof and a mixture thereof.

7. The method of claim 1, wherein the second conductive powder comprises a metal selected from the group consisting of tin (Sn), bismuth (Bi), lead (Pb), indium (In), gallium (Ga), alloy thereof and a mixture thereof.

8. The method of claim 1, wherein the first conductive powder is 8 to 99 wt % and the second conductive powder is 1 to 92 wt % based on the weight of the conductive powder.

9. The method of claim 1, wherein the electrode is heated at 50 to 120° C. in the heating step (B) and the electrode is heated again at 100 to 350° C. after the pressing step (C).

10. The method of claim 1, wherein the first conductive powder is 8 to 50 wt % of Cu powder and the second conductive powder is 50 to 92 wt % of Sn powder based on the weight of the conductive powder.

11. An electrical device comprising the non-firing type electrode manufactured by the method of claim 1.

* * * * *

UNITED STATES PATENT AND TRADEMARK OFFICE
CERTIFICATE OF CORRECTION

Page 1 of 1

PATENT NO. : 9,093,675 B2
APPLICATION NO. : 13/746157
DATED : July 28, 2015
INVENTOR(S) : Akira Inaba et al.

It is certified that error appears in the above-identified patent and that said Letters Patent is hereby corrected as shown below:

IN THE CLAIMS

Column 9, Claim 1, Line 25, after the word "substrate" insert the word -- is --.

Signed and Sealed this
Twenty-fourth Day of November, 2015

Michelle K. Lee
*Director of the United States Patent and Trademark Office*